(12) United States Patent
Mignoli et al.

(10) Patent No.: US 10,574,026 B2
(45) Date of Patent: Feb. 25, 2020

(54) CIRCUIT AND METHOD FOR DRIVING A LASER DIODE

(71) Applicant: Infineon Technologies AG, Neubiberg (DE)

(72) Inventors: Franco Mignoli, Verona (IT); Maurizio Galvano, Padua (IT); Andrea Logiudice, Montegrotto Terme (IT)

(73) Assignee: Infineon Technologies AG, Neubiberg (DE)

( * ) Notice: Subject to any disclaimer, the term of this patent is extended or adjusted under 35 U.S.C. 154(b) by 16 days.

(21) Appl. No.: 15/923,823

(22) Filed: Mar. 16, 2018

(65) Prior Publication Data

US 2018/0278017 A1 Sep. 27, 2018

Related U.S. Application Data

(60) Provisional application No. 62/475,665, filed on Mar. 23, 2017.

(51) Int. Cl.
| | | |
|---|---|---|
| *H01S 5/00* | (2006.01) | |
| *H01S 5/026* | (2006.01) | |
| *H01S 5/042* | (2006.01) | |
| *H01S 5/022* | (2006.01) | |
| *H01S 5/06* | (2006.01) | |
| *H01S 5/062* | (2006.01) | |

(52) U.S. Cl.
CPC ............ *H01S 5/0261* (2013.01); *H01S 5/005* (2013.01); *H01S 5/02276* (2013.01); *H01S 5/042* (2013.01); *H01S 5/0428* (2013.01); *H01S 5/0607* (2013.01); *H01S 5/06216* (2013.01)

(58) Field of Classification Search
CPC .... H01S 5/042; H01S 5/02244; H01S 5/0261; H01S 5/0607; H01S 5/06216; H01S 5/005; H01S 5/02276
See application file for complete search history.

(56) References Cited

U.S. PATENT DOCUMENTS

| | | | |
|---|---|---|---|
| 3,755,697 A | 8/1973 | Miller | |
| 5,604,759 A | 2/1997 | Miyaki | |
| 5,889,583 A | 3/1999 | Dunne | |
| 6,697,402 B2 | 2/2004 | Crawford | |
| 9,295,116 B2 * | 3/2016 | Sanders | H05B 33/0815 |
| 2003/0039280 A1 | 2/2003 | Mangano et al. | |
| 2006/0291512 A1 * | 12/2006 | Borschowa | H01S 5/0683 |
| | | | 372/38.02 |

(Continued)

OTHER PUBLICATIONS

Office Action, in the German language, from counterpart German Application No. 102018106861.1, dated Oct. 23, 2019, 4 pp.

*Primary Examiner* — Kinam Park
(74) *Attorney, Agent, or Firm* — Shumaker & Sieffert, P.A.

(57) ABSTRACT

A driver circuit for driving a laser diode is described herein. In accordance with a first exemplary embodiment the driver circuit includes a first electronic switch connected to an output node that is configured to be operably connected to a laser diode. The electric connection between the first electronic switch and the output node has a first inductance. The driver circuit further includes a bypass circuit that is coupled to the output node and configured to take over, when activated, the current supplied to the output node via the first electronic switch, thus magnetizing the first inductance.

17 Claims, 5 Drawing Sheets

(56) References Cited

U.S. PATENT DOCUMENTS

| | | | |
|---|---|---|---|
| 2009/0059981 A1 | 3/2009 | Mizusako et al. | |
| 2010/0177127 A1* | 7/2010 | Akiyama | G09G 3/36 |
| | | | 345/690 |
| 2014/0204396 A1* | 7/2014 | Giger | H01S 5/0428 |
| | | | 356/614 |
| 2015/0381172 A1 | 12/2015 | Zafrany et al. | |
| 2017/0040770 A1 | 2/2017 | Gyoten et al. | |
| 2017/0054272 A1* | 2/2017 | Chiu | H01S 5/0428 |

* cited by examiner

CIRCUIT AND METHOD FOR DRIVING A LASER DIODE

This Application claims the benefit of U.S. Provisional Application 62/475,665, filed Mar. 23, 2017, the entire content of which is incorporated herein by reference.

TECHNICAL FIELD

This disclosure in general relates to the field of driver circuits for laser diodes, and particular to driver circuits allowing the generation of short laser pulses for use in LIDAR systems.

BACKGROUND

Light Detection and Ranging (LIDAR) relates to a surveying method for measuring distance to an object (referred to as target) by illuminating the target with pulsed laser light, wherein the distance information may be obtained from the time-of-flight (TOF) of the light pulse travelling from the light source to the target and back to the detector. This time-of-flight is sometimes also referred to as round trip delay time (RTDT); the measured distance is basically the product between the RTDT and the speed of light. LIDAR is used, for example, in so-called time-of-flight cameras (TOF cameras), which allows mapping depth information to individual pixels and capturing the entire scene within the field of view of the TOF camera simultaneously. In contrast thereto, a scanning LIDAR scans the scene pointwise by deflecting the laser with, e.g., a mirror such as a microscanner (also referred to as micro-scanning mirror).

The irradiance (power per unit area) of the reflected light pulse arriving at the detector decreases with increasing distance of the target. To achieve a measurement range of up to several 10 or 100 meters, the radiant power of the emitted laser light (and thus the electrical power of the laser diode) is comparably high. However, to ensure that the laser pulses are harmless for the eyes of persons standing nearby, the laser pulses have to be comparably short to limit the radiant energy of a laser pulse. For a rectangular shaped pulse (power over time), the pulse energy would be proportional to the product of pulse width and power. In a realistic example, the peak power of a laser pulse may be up to 80 W or more with a pulse width in the range of 1 ns to 100 ns. To generate such short pulses the driver electronics used to drive the laser diode should be capable of switching the load current of the laser diode with extremely short rise and fall times.

SUMMARY

A driver circuit for driving a laser diode is described herein. In accordance with a first exemplary embodiment the driver circuit includes a first electronic switch connected to an output node that is configured to be operably connected to a laser diode. The electric connection between the first electronic switch and the output node has a first inductance. The driver circuit further includes a bypass circuit that is coupled to the output node and configured to take over, when activated, the current supplied to the output node via the first electronic switch, thus magnetizing the first inductance.

In accordance with a second exemplary embodiment the driver circuit includes a first and a second transistor half-bridge forming a H-bridge that has a first output node and a second output node configured to operably couple a laser diode in between. Each transistor half-bridge is composed of a high-side transistor and a low-side transistor. Control circuitry is configured to switch on, in a pre-charging phase, the high-side and the low-side transistors of the first and the second transistor half-bridges to magnetize any inductances coupled in series to the high-side and the low-side transistors. Control circuitry is configured to switch off, in a ramp-up phase, the low-side transistor of the first transistor half-bridge and the high-side transistor of the second transistor half-bridge, thus directing current, which passes through the high-side transistor of the first transistor half-bridge and the low-side transistor of the second transistor half-bridge and through inductances coupled in series thereto, through the laser diode via the first and the second output node.

Furthermore, a method for driving a laser diode is described herein. In accordance with one exemplary embodiment, the method includes directing a first current, via a first electronic switch to an output node, which is operably coupled to the laser diode. Thus a first inductance effective between the first electronic switch and the output node is magnetized. The method further includes draining the first current, by activating a bypass circuit, from the output node. Thus the laser diode is bypassed. Further, the method includes directing the first current to the laser diode via the output node by deactivating the bypass circuit.

BRIEF DESCRIPTION OF THE DRAWINGS

The invention can be better understood with reference to the following description and drawings. The components in the figures are not necessarily to scale, emphasis instead being placed upon illustrating the principles of the invention. Moreover, in the figures, like reference numerals designate corresponding parts. In the drawings.

DETAILED DESCRIPTION

Figure 1A:
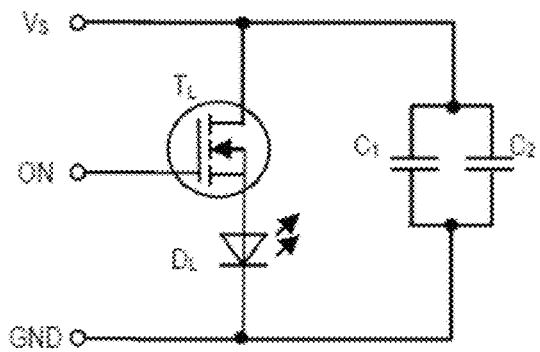
FIG. 1A is a circuit diagram of a laser diode and an electronic switch for switching the laser diode and FIG. 1B is a schematic drawing of a corresponding chip package.
Figure 1B:
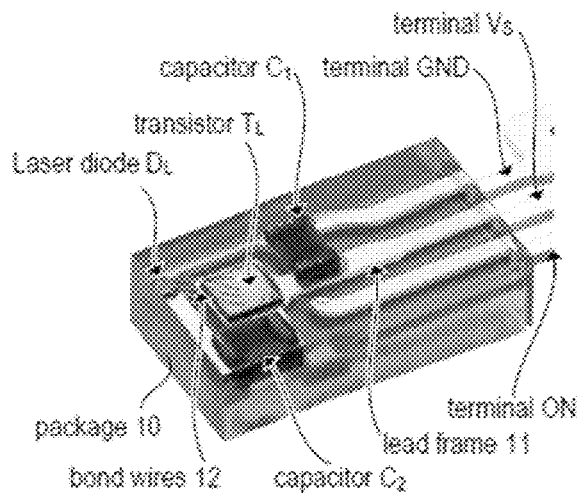

FIGS. 1A and 1B illustrate a laser diode and a portion of a driver circuit used to drive the laser diode. FIG. 1A is a circuit diagram of a laser diode $D_L$ and an electronic switch $T_{HS}$ for switching the laser diode $D_L$ on and off. Accordingly, a series circuit of laser diode DL and electronic switch $T_{HS}$ is coupled between ground terminal GND and supply terminal, at which a supply voltage $V_S$ is applied. At least one capacitor (in the present example a parallel circuit of capacitors $C_1$ and $C_2$) is connected in parallel to the series circuit of laser diode DL and electronic switch $T_{HS}$ in order to buffer the supply voltage $V_S$ and provide load current to the laser diode $D_L$. The electronic switch $T_{HS}$ may be a MOSFET or any other suitable transistor type (e.g. BJT). The control (gate or base) terminal of the electronic switch $T_{HS}$ is labelled ON in the present example. Generally the buffer capacitance provided by capacitors $C_1$ and $C_2$ is needed to allow fast transients of the load current.

FIG. 1B is a schematic drawing of a laser diode module 1 with a chip package 10 including the circuit of FIG. 1A. Accordingly, the chip package includes a first semiconductor die including the electronic switch $T_{HS}$, a second semiconductor die including the laser diode $D_L$, and at least a third semiconductor die providing the buffer capacitance. Corresponding to diagram (a) of FIG. 1, to separate capacitors are used in the present example. A lead frame 11 provides three pins corresponding to the supply terminal (voltage $V_S$), the ground terminal GND and the control terminal ON, wherein the middle terminal is the supply terminal. The semiconductor dies including the buffer capacitors $C_1$ and $C_2$ are directly (i.e. without using a bond wire) bonded (e.g. soldered) to the lead frame 11 and provide a buffer capacitance between the pins representing ground and supply terminal. The bottom metallization of the semiconductor die including the MOSFET $T_{HS}$ represents the drain electrode of the MOSFET and is directly bonded to the pin representing the supply terminal. The gate electrode in the top metallization layer of MOSFET $T_{HS}$ is connected to the pin representing the control terminal ON via a bond wire. Similarly, the source electrode in the top metallization layer of MOSFET $T_{HS}$ is connected to the anode electrode on the top surface of laser diode $D_L$ via bond wires 12. The cathode electrode at the bottom surface of the laser diode $D_L$ is directly bonded to the lead frame 11.

Figure 2:
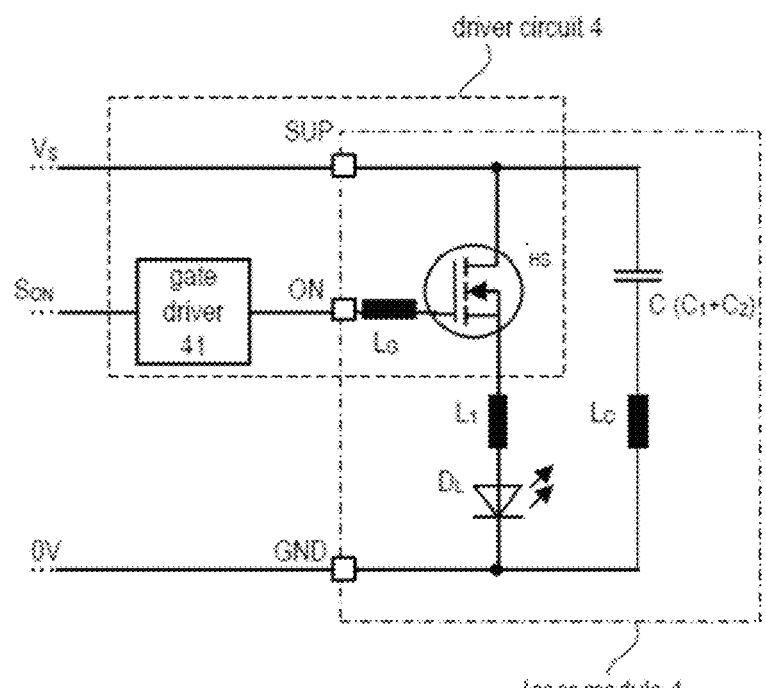
FIG. 2 illustrates an electric equivalent circuit of the laser diode package including parasitic inductances.

FIG. 2 illustrates a simplified electrical equivalent circuit of the laser diode module 1 of FIG. 1. Additionally, the circuit of FIG. 2 includes a gate driver circuit 41 coupled to the control electrode of the MOSFET $T_{HS}$ and configured to generate drive signals suitable to switch the MOSFET $T_{HS}$ on and off in accordance with a logic signal $S_{ON}$. Apart from the gate driver 41, the circuit of FIG. 2 is substantially the same as in FIG. 1A except the inductors $L_1$, $L_C$ and $L_G$ that represent parasitic inductances of the bond wires 12 (corresponds to inductance $L_1$), the electric connections between the capacitors $C_1$ and $C_2$ and the laser diode $D_L$ (corresponds to inductance $L_C$), and the electric connection (e.g., bond wire) between the control terminal ON and the actual control electrode of the MOSFET $T_{HS}$ (corresponds to inductance $L_G$). Together, the gate driver 41 and the electronic switch $T_{HS}$ may be regarded as driver circuit 4 for driving the laser diode $D_L$.

In LIDAR systems the measurement range depends on the radiant power of the laser pulse. However, to limit the pulse energy (to protect the eyes of persons in the environment of the LIDAR system) the laser pulses need to be rather short. The voltage drop $V_{LEFF}$ across the effective parasitic inductance $L_{EFF}$ ($L_{EFF}=L_C+L_1$) is given by $$V_{LEFF}=L_{EFF}\cdot \Delta i_L/t_{rise} \text{ and } V_{LEFF}=L_{EFF}\cdot \Delta i_L/t_{fall}$$

wherein $\Delta i_L$ is change of the load current (e.g. from 0 A to 40 A or from 40 A to 0 A), $t_{rise}$ is the respective rise time and $t_{fall}$ respective fall time. Assuming an effective inductance of 5 nH and a rise time of 2 ns yields a voltage drop of 100V. Accordingly, the system including the capacitors would have to be designed for a voltage of more than 110V (assuming 10V voltage drop across the laser diode and the MOSFET) in order to achieve the desired peak current within the desired rise time. It is noted, that a rise time of 2 ns may be too long for some applications. With the integration approach as illustrated in FIG. 1B, the inductance $L_{EFF}$ may be significantly reduced (e.g. below 2 nH or even below 1 nH). The remaining inductance is predominantly caused by the bond wires 12 used to connect the MOSFET TL and the laser diode $D_L$. For example, the voltage drop $V_{LEFF}$ is still 80V when reducing the inductance $L_{EFF}$ to 1 nH when the load current is to be ramped up to 40 A within a rise time of 0.5 ns.

One insight from the above analysis is that relatively high voltages (as compared to the forward voltage of the laser diode) are needed to generate the fast current transients (steep current ramps with very short rise or fall times) of the load current passing through the laser diode. Higher voltages entail an increased complexity and costs of the driver circuit. For example, e.g. transistors and buffer capacitors with comparably breakdown voltage are needed; charge-pumps may be needed for charging the buffer capacitors to the desired voltage. The driver circuits described herein are designed to generate steep current ramps for driving the laser diode with a comparably low supply voltage.

Figure 3:
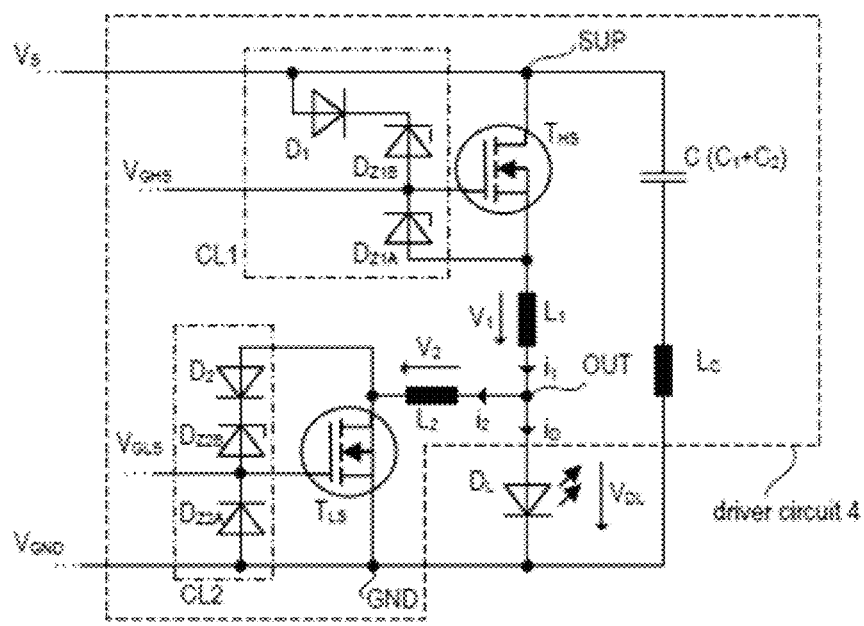
FIG. 3 is a circuit diagram illustrating a first example of a driver circuit for driving a laser diode.

FIG. 3 is a circuit diagram illustrating a first example of a driver circuit 4 for driving a laser diode $D_L$. As in the example of FIG. 2, the parasitic inductances, which are relevant for the generation of the current ramps for the laser diode $D_L$, are shown in FIG. 3. Accordingly, the driver circuit includes a transistor half-bridge composed of a high-side transistor $T_{HS}$ and a low side transistor $T_{LS}$. These transistors $T_{HS}$ and $T_{LS}$ are coupled in series between a supply node SUP, at which supply voltage $V_S$ is applied, and a ground node GND, which is at reference potential $V_{GND}$ (e.g. 0V). The circuit node that forms the middle tap of the transistor half-bridge is denoted as OUT. The electrical lines connecting the circuit node OUT and the transistors $T_{HS}$ and $T_{LS}$ are represented by the inductors $L_1$ and $L_2$. As mentioned bond wires or any other electric lines contacting the transistors' electrodes may give rise to significant inductances as discussed above. As can be seen in FIG. 3, the laser diode $D_L$ is connected between the circuit node OUT and ground GND. Furthermore, one or more buffer capacitors, collectively represented by capacitor C) are connected between the supply node SUP and ground GND. As in the example in FIG. 2, an inductor $L_C$ connected in series to capacitor C represents the parasitic inductance resulting from the electrical lines contacting the capacitor(s). In the present example, the transistors $T_{HS}$ and $T_{LS}$ are n-channel MOSFETs. However, any other transistor types (e.g. bipolar junction transistors) may be used in other implementations. When using MOSFETs, the high-side transistor $T_{HS}$ may also be implemented as a p-channel MOS transistor.

Clamping circuits CL1 and CL2 are coupled to the transistors $T_{HS}$ and $T_{LS}$, respectively. Clamping circuit CL1 is configured to take over the inductor current $i_1$ passing through inductor $L_1$, when the transistor $T_{HS}$ is switched off. Accordingly, the gate of transistor $T_{HS}$ is (re-) activated for a short time period (or deactivation is delayed for a short time period) thus allowing the inductor $L_1$ to "discharge" (demagnetize). Similarly, clamping circuit CL2 is configured to take over the inductor current is passing through inductor $L_2$, when the transistor $T_{LS}$ is switched off. Similarly, the gate of transistor $T_{LS}$ is (re-) activated for a short time period (or deactivation is delayed for a short time period) thus allowing the inductor $L_2$ to "discharge" (demagnetize). The mentioned re-activation (or delay of deactivation) of the transistors $T_{HS}$ and $T_{LS}$ during clamping is triggered by the drain-source voltage across the transistors $T_{HS}$ and $T_{LS}$ exceeding a clamping voltage defined by Zener diodes included in the clamping circuits. Besides current commutation, clamping circuits CL1 and CL2 may limit the voltage across the gate dielectric in order to protect the transistors $T_{HS}$ and, respectively, $T_{LS}$. (in case of a MOS transistor).

In the present example, the clamping circuit CL1 is connected between the source electrode of transistor THS and the supply node SUP, and includes a series circuit of Zener diodes DZ1A, DZ1B and normal diode D1. While commutating the inductor current i1, diode D1 is forward biased and Zener diodes DZ1A and DZ1B are operated in the Zener or avalanche breakdown and are thus reverse conducting. The Zener diode DZ1A is connected between source and gate of transistor THS to limit the gate-source voltage and protect the gate dielectric of transistor THS. Diode D1 and Zener diode DZ1B are connected between gate of transistor THS and supply node SUP. Clamping circuit CL2 includes a series circuit of Zener diode DZ2B and normal diode D2 coupled between drain and gate of transistor TLS, and a further Zener diode DZ2A coupled between gate and source of the transistor TLS. While commutating the inductor current i2, diode D2 is forward biased and Zener diode DZ2B is operated in the Zener or avalanche breakdown and is thus reverse conducting. The diodes D2 and DZ2B, which are connected between drain and gate of transistor TLS, thus can pull up the gate potential of transistor TLS (when the drain voltage rises to the mentioned clamping voltage of, e.g., 40V) to a level high enough to delay a complete switch-off of transistor for a short time-interval, during which the inductor L2 can demagnetize. Clamping circuit CL1 operates substantially in the same way.

It is noted that the clamping circuits CL1 and CL2 are merely one exemplary implementation suitable for n-channel MOS transistors $T_{HS}$ and $T_{LS}$. Other implementations of clamping circuits may be used dependent on the actual application. Diodes $D_1$ and $D_2$ blocks the current path through the Zener diodes $D_{Z1B}$ and $D_{Z2B}$ between gate and drain of transistors $T_{HS}$ and, respectively, $T_{LS}$, when switching the transistors $T_{HS}$ and $T_{LS}$ on. As mentioned, the main purpose of the clamping circuits CL1 and CL2 is clamping, i.e. to take over the inductor currents when the respective transistor is switched off in order to delay the actual switch-off of the respective transistor and allow demagnetization of the respective inductor. It is noted that gate drivers (see FIG. 2, gate driver 10) have been omitted in the example of FIG. 3 in order to keep the illustrations simple. Suitable gate driver circuits are as such known and are thus not explained in more details.

The function of the driver circuit of FIG. 3 is now explained with reference to the timing diagrams shown in FIG. 4. In particular, FIG. 4 includes diagram 4a, 4b and 4c. In LIDAR systems a sequence of consecutive current (and light) pulses is usually generated to obtain a sequence of corresponding range measurement values. The timing diagrams illustrates the inductor currents $i_1$ and $i_2$ as well as the load current $i_D$ passing through the laser diode $D_L$ (diode current) throughout one pulse period (i.e. time instant $t_0$ to time instant $t_4$). According to the present example, the inductors $i_1$ and $i_2$ are "pre-charged" with a magnetic flux (i.e. magnetized) before the diode current $i_D$ is actually switched on. Diagram (4a) of FIG. 4 illustrates one exemplary waveform of the inductor current $i_1$, diagram (4b) of FIG. 4 illustrates one exemplary waveform of the inductor current $i_2$, and diagram (4c) of FIG. 4 illustrates one exemplary waveform of the diode current $i_D$.

Figure 4:
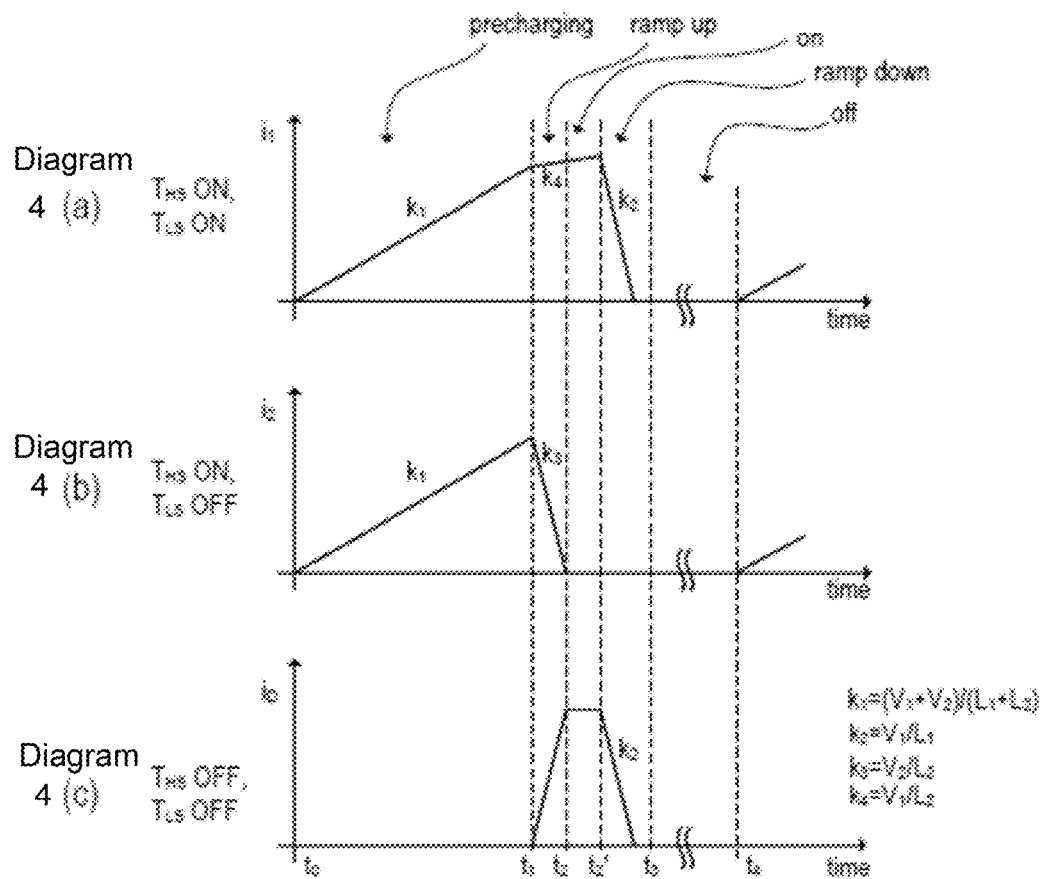
FIG. 4 is a graph of timing diagrams (diagrams 4a, 4b, and 4c) illustrating the function of the circuit of FIG. 3.

According to the example of FIG. 4 a pulse period may be segmented into five phases. During the first phase (before time instant $t_0$ and between time instants $t_3$ and $t_4$) both transistors $T_{HS}$ and $T_{LS}$ are switched off and the inductor currents $i_1$ and $i_2$ as well as the diode current $i_D$ are zero (off phase). The second phase is the pre-charging phase starting at time instant $t_0$ (or $t_4$ in the subsequent pulse period), during which both transistors $T_{HS}$ and $T_{LS}$ are conductive (switched on). The inductances $L_1$ and $L_2$ (and their intrinsic series resistances) form a voltage divider and are designed such that the voltage VD at the middle tap OUT of the transistor half-bridge (which is also the middle-tap of the voltage divider) does not exceed the forward voltage of the laser diode $D_L$ (e.g. 2.2V). Therefore, the diode current $i_D$ remains substantially zero during the pre-charging phase while the inductor currents $i_1$ and $i_2$ ($i_1=i_2$, $i_D=0$) ramp up as shown in diagrams (4a) and (4b) of FIG. 4. Thereby, the slope $k_1$ of the inductor currents $i_1$ and $i_2$ is $k_1=(V_1+V_2)/(L_1+L_2)$, wherein $V_1$ and $V_2$ denote the voltage drop across the inductors $L_1$ and $L_2$, respectively. At time instant $t_1$ the energies $E_1$ and $E_2$ stored in the inductors $L_1$ and $L_2$, respectively, are $E_1=(L_1 \cdot i_1^2)/2$ and $E_1=(L_2 \cdot i_2^2)/2$. The voltage $V_1+V_2$ across the inductors is comparably low, e.g. 2V to 5V. It is noted that the low-side transistor $T_{LS}$ may be regarded as a bypass circuit configured to take over, when activated, the inductor current $i_1$ (note, $i_1=i_2$ during the pre-charging phase) provided via the high-side transistor $T_{HS}$, and the diode current $i_D$ remains substantially zero during this phase.

The third phase is the ramp-up phase starting at time instant $t_1$, during which transistor $T_{HS}$ remains on, whereas transistor $T_{LS}$ is switched off at time instant $t_1$. As the current path through transistor $T_{LS}$ is no longer available, the inductor current $i_1$ is drained via the laser diode and the diode current $i_D$ ramps up very steeply within a very short rise time, while the inductor current $i_2$ is commutated by the clamping circuit CL2 comparably fast. During this phase the voltage $V_2$ across the inductor $L_2$ may drop down to approximately −40V. The forth phase is referred to as on-phase and starts at time instant $t_2$, at which inductor current $i_2$ reaches zero and inductor $L_2$ is completely demagnetized. The on-phase continues until time instant $t_2'$. The fifth phase is the ramp-down phase starting at time instant $t_2'$, during which transistor $T_{LS}$ remains off, wherein transistor $T_{HS}$ is also switched off at time instant $t_2'$. As the current path through transistor $T_{HS}$ is no longer available, the inductor current $i_1$ is commutated by the clamping circuit CL1 comparably fast. As mentioned, Zener diode $D_{Z1A}$ ensured that the gate-source voltage of transistor $T_{HS}$ does not become too high and thus protects the gate dielectric. During this phase the voltage $V_1$ across the inductor $L_1$ may drop down to approximately −40V. At time instant $t_3$ the inductor current $i_1$ has dropped to zero amperes (i.e. inductor $L_1$ is completely demagnetized), the ramp-down phase ends and the mentioned off phase begins until a new pre-charge phase is initiated at time $t_4$.

Figure 5:
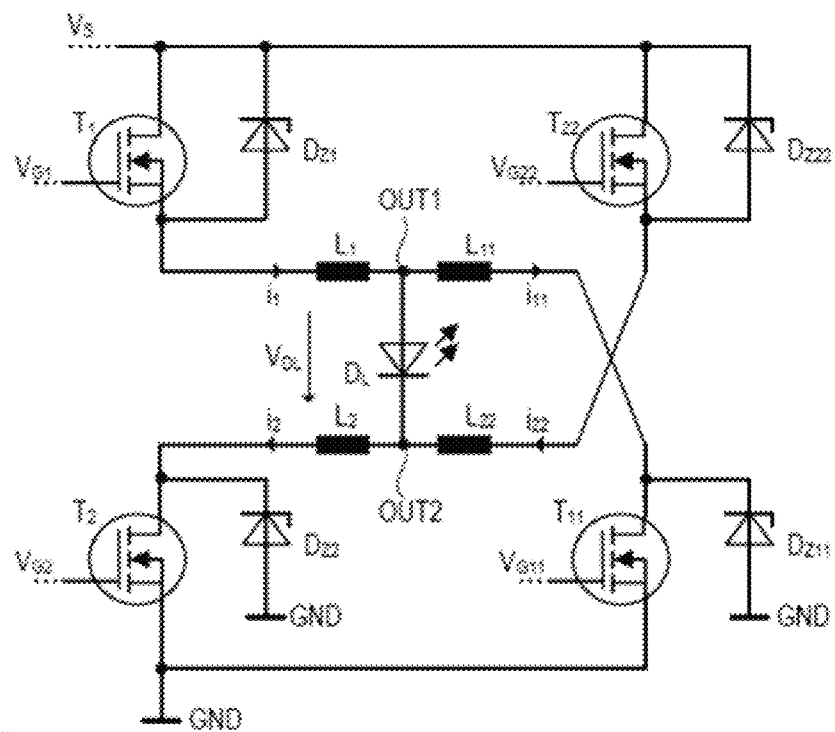
FIG. 5 is a circuit diagram illustrating a second example of a driver circuit for driving a laser diode.

FIG. 5 is a circuit diagram illustrating another implementation of a driver circuit 4 for driving a laser diode $D_L$. In the present example, the driver circuit includes four transistors which are connected to two transistor half-bridges and thus form a transistor H-bridge. Accordingly, a first half-bridge is formed by high-side transistor $T_1$ and low-side transistor $T_{11}$. Circuit node OUT1 is the middle tap of the first half-bridge. Similarly, a second half-bridge is formed by high-side transistor $T_{22}$ and low-side transistor $T_2$. Circuit node OUT2 is the middle tap of the second half-bridge. Both half-bridges are connected between supply node SUP, at which supply voltage $V_S$ is applied, and ground node GND. The laser diode $D_L$ is connected between circuit nodes OUT1 and OUT2. The inductances of the electric lines between the circuit node OUT1 and the transistors $T_1$ and $T_{11}$ are represented by inductors $L_1$ and $L_{11}$, respectively. Similarly, the inductances of the electric lines between the circuit node OUT2 and the transistors $T_2$ and $T_{22}$ are represented by inductors $L_2$ and $L_{22}$, respectively. Each transistor $T_1$, $T_2$, $T_{11}$, $T_{22}$ is coupled by a respective clamping circuit which is represented by the Zener diodes $D_{Z1}$, $D_{Z2}$, $D_{Z11}$, $D_{Z22}$, respectively. It is noted that the clamping circuit are simplified in the present example and may be more complex (e.g. like in FIG. 3) in other examples.

Figure 6:
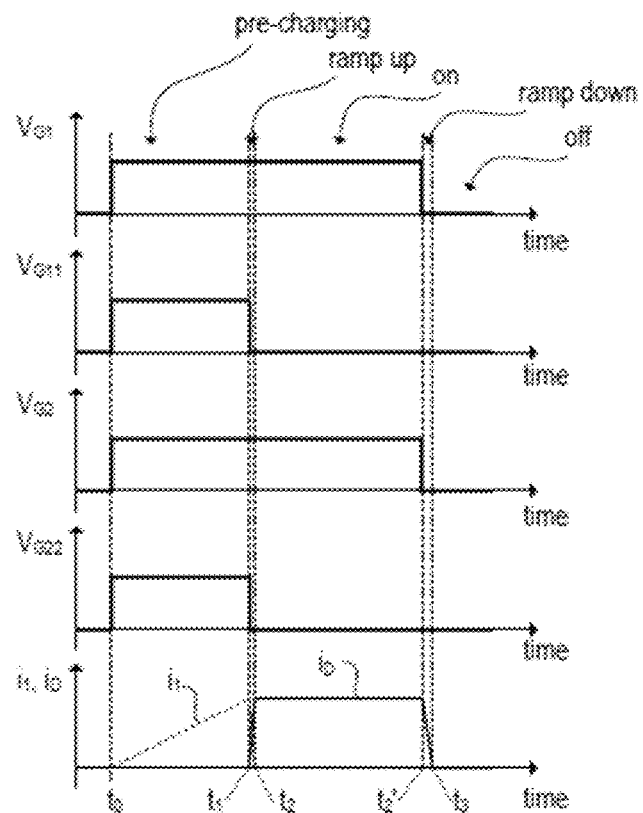
FIG. 6 includes timing diagrams illustrating the function of the circuit of FIG. 5.

The function of the driver circuit of FIG. 5 is explained now with reference to the timing diagram of FIG. 6. It is noted, however, that the operation principle of the present example is similar to the operation principle of the previous example shown in FIG. 3. Accordingly, the inductors $L_1$ and $L_{11}$ as well as $L_2$ and $L_{22}$ are pre-charged during a pre-charging phase, in which all transistors $T_1$, $T_{11}$, $T_2$, $T_{22}$ are conductive (switched on). This phase is illustrated in the timing diagrams of FIG. 6, between time instants $t_0$ and $t_1$. The first four diagrams (from the top) in FIG. 6 show exemplary waveforms of the gate signals applied to transistors $T_1$, $T_{11}$, $T_2$, $T_{22}$. The bottom diagram of FIG. 6 shows exemplary waveforms of the inductor current $i_1$ and the diode current $i_D$. One can see, the inductor current $i_1 = i_{11}$ ramps up between time instant $t_0$ (at which all transistors are switched on) and time instant $t_1$. In a symmetric set-up the voltage at circuit nodes OUT1 and OUT2 is the same during the pre-charging phase, and thus the voltage $V_{DL}$ across the laser diode $D_L$ is zero; the inductor currents are identical, i.e. $i_1 = i_2 = i_{11} = i_{22}$. As in the previous example of FIG. 3, transistors $T_{11}$ (and also transistor $T_{22}$) can be regarded as bypass circuit configured to provide, when activated during the pre-charging phase, a current path for the inductor currents in order to bypass the laser diode $D_L$. When deactivated (at the beginning of the subsequent ramp-up phase) this bypass is closed and the current is forced to pass the laser diode.

At time instant $t_1$ the ramp-up phase is initiated by triggering a switch-off of transistors $T_{11}$ and $T_{22}$. As a result, the inductor currents $i_1$ and $i_2$ are taken over by the laser diode $D_L$ and, thus, the diode current $i_D$ ramps up within a very short rise time $t_{rise} = t_2 - t_1$, while the inductor currents $i_{11}$ and $i_{22}$ are taken over by the Zener diodes $D_{Z11}$ and $D_{Z22}$ (clamping circuits CL11 and CL22). In addition to the example of FIG. 3, the transistors $T_1$ and $T_2$ remain on between time instants $t_2$ and $t_2'$, i.e. during the on phase before, at time instant $t_2'$, a switch-off of transistors $T_1$ and $T_2$ is triggered at the beginning of the ramp-down phase. During the ramp-down phase (between time instants $t_2'$ and $t_3$) the inductor currents $i_1$ and $i_2$ are taken over by the Zener diodes $D_{Z1}$ and $D_{Z2}$ (clamping circuits CL1 and CL2) and the current falls down to zero (see FIG. 6, time instant $t_3$). The subsequent phase is the off phase that lasts until a new pre-charge phase is triggered.

Figure 7:
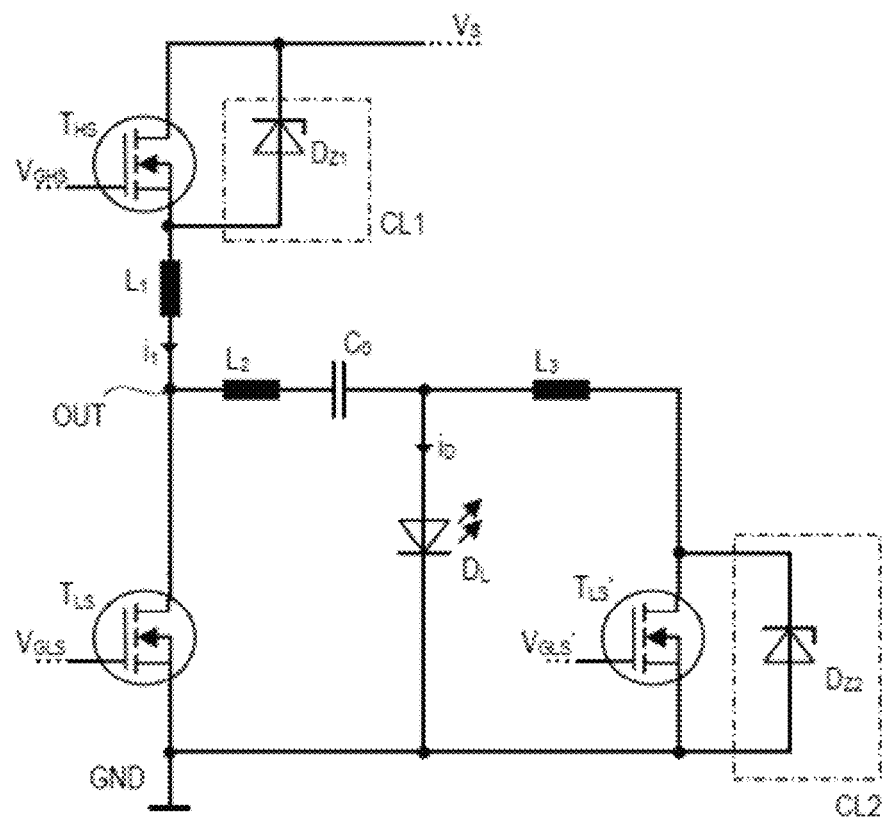
FIG. 7 is a circuit diagram illustrating a third example of a driver circuit for driving a laser diode.

FIG. 7 is a circuit diagram illustrating another implementation of a driver circuit 4 for driving a laser diode $D_L$. The example of FIG. 7 is a modification of the previous example of FIG. 3 with an additional safety feature. As discussed above, the maximum radiant power of the laser diode is rather high (up to e.g. 40 W and more) in order to achieve a significant measurement range in LIDAR systems. However, the duration of the pulses (pulse width) must be sufficiently short in order to limit the pulse energy (radiant power times pulse width) to values that are harmless for the human eye (for a given pulse repetition frequency). When using a driver circuit as illustrated in FIG. 3 a dangerous situation may occur when the high-side switch $T_{HS}$ fails to switch-off the diode current $i_D$ (for whatever reason). In such a situation the laser diode would be operated as a continuous wave (CW) laser with a radiant power of several watts (which would correspond to a class 3B or class 4 laser).

The example of FIG. 7 is essentially the same as the example of FIG. 3 with an additional capacitor $C_0$ inserted between circuit node OUT (middle tap of the half-bridge formed by transistors $T_{HS}$ and $T_{LS}$) and the laser diode $D_L$. The parasitic inductance caused by the electric line between the high-side transistor T# and the circuit node OUT is represented by inductor $L_1$. The parasitic inductance caused by the electric line between the circuit node OUT and the capacitor $C_0$ is represented by inductor $L_2$. Capacitor $C_0$ decouples the high-side transistor $T_{HS}$ (und thus the supply node providing supply voltage $V_S$) from the laser diode for DC currents. Thus, even if the high-side transistor would cause a short-circuit between the circuit node OUT and the supply node (voltage $V_S$) a CW operation of the laser diode $D_L$ is prevented by capacitor $C_0$, which blocks DC current from the laser diode $D_L$. To safely switch-off the laser diode $D_L$ a further low-side switch $T_{LS}'$ may be coupled in parallel to the laser diode $D_L$. The parasitic inductance caused by the electric line between the laser diode $D_L$ and transistor $T_{LS}'$ is represented by inductor $L_3$, which may have a comparably low inductance.

Figure 8:
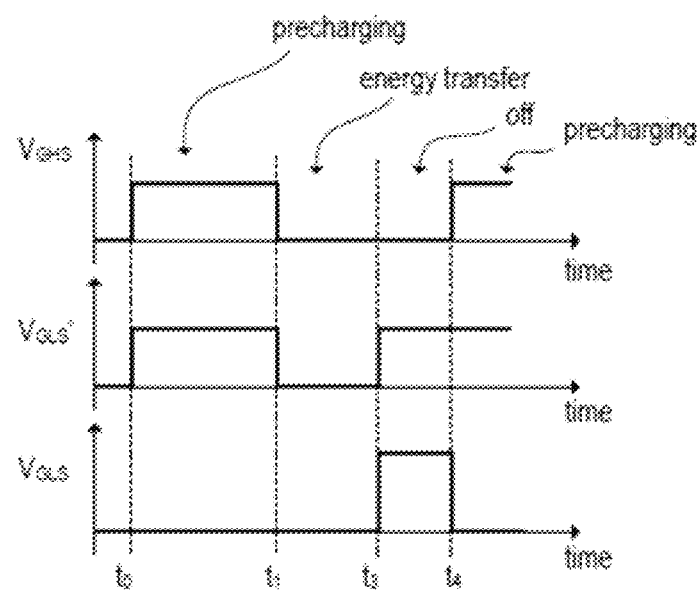
FIG. 8 includes timing diagrams illustrating the function of the circuit of FIG. 7.

The function of the driver circuit of FIG. 7 is explained now with reference to the timing diagrams of FIG. 8. Accordingly, in a first phase (pre-charging phase) between time instants to and $t_1$ the high-side transistor $T_{HS}$ and the additional low-side transistor $T_{LS}'$ are conductive, while low-side transistor $T_{LS}$ is off. Thus, the inductor current $i_1$ passing through inductors $L_1$, $L_2$, and $L_3$ as well as capacitor $C_0$ ramps up as in the example of FIG. 3. The energy $E_{123}$ stored in inductance $L_1 + L_2 + L_3$ is $E_{123} = ((L_1 + L_2 + L_3) \cdot i_1^2)/2$. During the second phase (energy transfer phase) the Energy $E_{123}$ stored in the inductance is transferred to capacitor $C_0$ resulting in a transient current passing through the capacitor $C_0$, and this transient current is drained vie the laser diode $D_L$ as transistor $T_{LS}'$ is switched off at time instant $t_1$ (see second timing diagram in FIG. 8). A corresponding radiant power output is generated by the laser diode. The capacitor $C_0$ may be discharged in a third phase starting at time instant $t_3$, at which the both low-side transistors $T_{LS}$ and $T_{LS}'$ is switched on. Transistor $T_{LS}$ may remain on until time instant $t_4$, when a new pulse period is triggered. In other words, transistor $T_{LS}$ is activated at the end of the generated (current and corresponding light) pulse to completely discharge capacitor $C_0$ thus ensuring that the pulse is generated with the same defined initial conditions (capacitor $C_0$ discharged).

Figure 9:
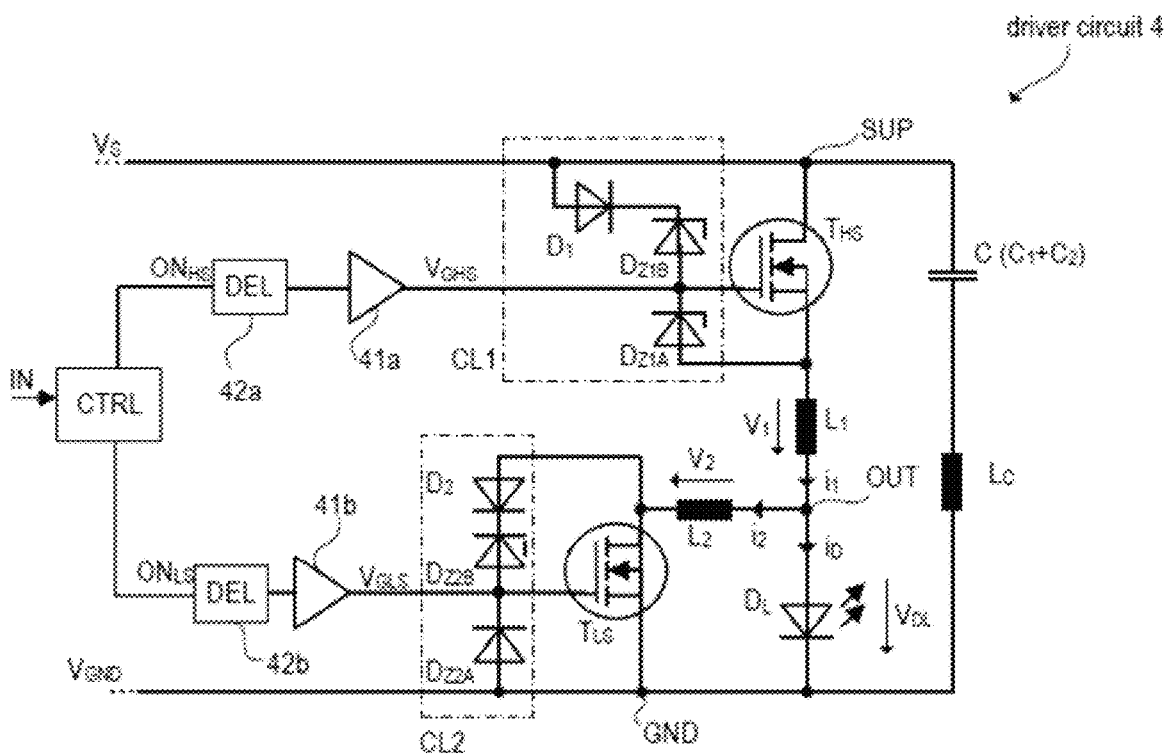
FIG. 9 is a circuit diagram illustrating a fourth example of a driver circuit for driving a laser diode.

As can be seen in the timing diagrams shown in FIGS. 4, 6, and 8, the timing of the switching time instants of the individual transistors determines the pulse width of the radiant power output generated by the laser diode. The example of FIG. 9 is the same as the previous example of FIG. 3. However, the present example additionally shows gate driver circuits 41a and 41b used to generate the gate voltages $V_{GHS}$ and $V_{GLS}$ for the transistors $T_{LS}$ and $T_{LS}$, respectively. The gate drivers 41a and 41b are configured to generate the gate voltages $V_{GHS}$ and $V_{GLS}$ in accordance with the (binary) logic signals $ON_{HS}$ and $ON_{LS}$, respectively. According to the present example, programmable delay circuits 42a, 42b may be coupled to the inputs of the gate drivers 41a and 41b, respectively. The delay circuits 42a, 42b are configured to delay the logic signals $ON_{HS}$ and $ON_{LS}$ by a defined (adjustable) delay time. Using the delay circuits 42a, 42b the timing of the logic signals $ON_{HS}$ and $ON_{LS}$ (and thus of the gate voltages $V_{GHS}$ and $V_{GLS}$) can be fine-tuned. In some applications, such a fine-tuning may be necessary, for example, to compensate for variations of the parasitic inductances and may be conducted at the end of production during a production test using, e.g. automatic testing equipment. The delay may be stored in a one-time programmable (OTP) memory, an EPROM or the like. The logic signals $ON_{HS}$ and $ON_{LS}$ may be generated by a controller circuit CTRL and the generation of these signal may be triggered by an input signal IN (logic signal). It is understood that the controller circuit CTRL may be any suitable logic circuit and may be, for example, be implemented using a programmable logic circuit, a microcontroller executing software instructions or the like. It is understood that, in any example described herein, the gate voltages supplied to the high-side and low-side transistors may be generated in a similar manner as in the present example of FIG. 9.

Figure 10:
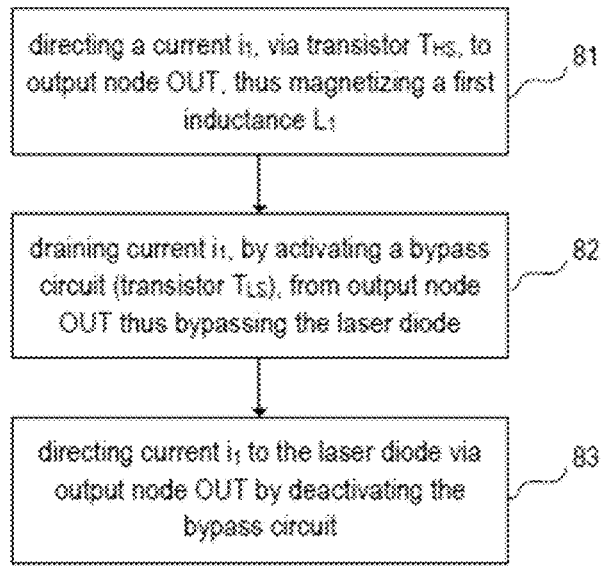
FIG. 10 is a flow chart illustrating one exemplary method for driving a laser diode.

FIG. 10 is a flow chart illustrating one exemplary method for driving a laser diode. This method may be realized using any of the driver circuits described herein. First, during a pre-charging phase (FIG. 10, step 81), a current (see, e.g. FIGS. 3, 5, and 7, inductor current is directed, via a first electronic switch (see FIGS. 3 and 7, high-side transistor $T_{HS}$; and FIG. 5, transistor $T_{11}$), to an output node (node OUT or OUT1), to which the laser diode is coupled. Thus, a first inductance effective between the first electronic switch and the output node is magnetized. Further during the pre-charging phase (FIG. 10, step 82), the current $i_1$ is drained via the active bypass circuit (see FIGS. 3, 5, and 7, low-side transistors $T_{LS}$, $T_{11}$, and $T_{LS}'$, respectively switched on) from the output node. Thus, the laser diode is bypassed and the diode current substantially zero while the inductors are magnetizes (pre-charged) In the subsequent ramp-up phase (FIG. 10, step 83), the current $i_1$ is directed to the laser diode via the output node by deactivating the bypass circuit (see FIGS. 3, 5, and 7, low-side transistors $T_{LS}$, $T_{11}$, and $T_{LS}'$, respectively switched off). As the inductance effective in the current path is already magnetized, the diode current can ramp up very steeply resulting in a comparably short rise time.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

EXAMPLES

Example 1

A driver circuit for driving a laser diode comprising a first electronic switch connected to an output node that is configured to be operably connected to a laser diode, the electric connection between the first electronic switch and the output node having a first inductance; and a bypass circuit coupled to the output node and configured to take over, when activated, the current supplied to the output node via the first electronic switch, thus magnetizing the first inductance.

Example 2

The driver circuit of example 1, wherein the electric connection between the output node and the bypass circuit has a second inductance, which is also magnetized when the bypass circuit is active.

Example 3

The driver circuit of example 1 or 2, further comprising a clamping circuit coupled to the first electronic switch configured to limit a voltage drop across the electronic switch in accordance with a clamping voltage.

Example 4

The driver circuit of any of examples 1 to 3, further comprising a clamping circuit coupled to the first electronic switch; the clamping circuit being configured, during switch-off of the first electronic switch, to delay the switch-off in order to allow the first inductance to demagnetize.

Example 5

The driver circuit of any of examples 1 to 4, further comprising a first driver coupled to a control electrode of the first electronic switch, the first driver being configured to generate a drive signal to switch the first electronic switch on an off in accordance with a first control signal.

Example 6

The driver circuit of example 5, further comprising a first delay circuit coupled to the first driver and configured to delay the first control signal by an adjustable delay time.

Example 7

The driver circuit of any of examples 1 to 6, wherein the bypass circuit includes a second electronic switch connected to the output node; the electric connection between the first electronic switch and the output node having a second inductance.

Example 8

The driver circuit of example 7, wherein the bypass circuit further includes a clamping circuit coupled to the second electronic switch; the clamping circuit being configured to take over current passing through the second inductance, when the second electronic switch is switched off.

Example 9

The driver circuit of example 7 or 8, further comprising a second driver coupled to a control electrode of the second electronic switch, the second driver being configured to generate a drive signal to switch the second electronic switch on an off in accordance with a second control signal.

Example 10

The driver circuit of example 9, further comprising a second delay circuit coupled to the second driver and configured to delay the second control signal by an adjustable delay time.

Example 11

The driver circuit of any of examples 1 to 10, further comprising a capacitor coupled between the first electronic switch and the output node, to decouple DC current passing from the first electronic switch to the output node.

Example 12

The driver circuit of example 11, further comprising a third electronic switch coupled in operably parallel to the laser diode.

Example 13

The driver circuit of any of examples 1 to 12, further comprising a half-bridge including a third electronic switch and a fourth electronic switch coupled between a supply node and a ground node, the middle tap of the half-bridge forming a further output node configured to be operably coupled to the laser diode, so that the laser diode is coupled between the output node and the further output node.

Example 14

The driver circuit of example 13, wherein the electric connection between the third electronic switch and the further output node having a third inductance; and wherein the electric connection between the fourth electronic switch and the further output node having a fourth inductance; and

Example 15

The driver circuit of example 14, further comprising a clamping circuit coupled to the third electronic switch; the clamping circuit being configured to take over current passing through the third inductance, when the third electronic switch is switched off; and a further clamping circuit coupled to the fourth electronic switch; the further clamping circuit being configured to take over current passing through the fourth inductance, when the fourth electronic switch is switched off.

Example 16

A driver circuit for driving a laser diode comprising a first and a second transistor half-bridge forming a H-bridge that has a first output node and a second output node configured to operably couple a laser diode in between, each transistor half-bridge being composed of a high-side transistor and a low-side transistor; and control circuitry configured to: switch on, in a pre-charging phase, the high-side and the low-side transistors of the first and the second transistor half-bridges to magnetize any inductances coupled in series to the high-side and the low-side transistors; and switch off, in a ramp-up phase, the low-side transistor of the first transistor half-bridge and the high-side transistor of the second transistor half-bridge, thus directing current, which passes through the high-side transistor of the first transistor half-bridge and the low-side transistor of the second transistor half-bridge and through inductances coupled in series thereto, through the laser diode via the first and the second output node.

Example 17

A method for driving a laser diode comprising: directing a first current, via a first electronic switch to an output node operably coupled to the laser diode thus magnetizing a first inductance effective between the first electronic switch and the output node; draining the first current, by activating a bypass circuit, from the output node thud bypassing the laser diode; and directing the first current to the laser diode via the output node by deactivating the bypass circuit.

We claim:

1. A driver circuit for driving a laser diode, the driver circuit comprising:
    a first electronic switch connected to an output node that is configured to be operably connected to the laser diode; the electric connection between the first electronic switch and the output node having a first inductance; and
    a bypass circuit coupled to the output node and configured to take over, when activated, the current supplied to the output node via the first electronic switch, thus magnetizing the first inductance.

2. The driver circuit of claim 1, wherein the electric connection between the output node and the bypass circuit has a second inductance, which is also magnetized when the bypass circuit is active.

3. The driver circuit of claim 1, further comprising a clamping circuit coupled to the first electronic switch configured to limit a voltage drop across the electronic switch in accordance with a clamping voltage.

4. The driver circuit of claim 1, further comprising a clamping circuit coupled to the first electronic switch; the clamping circuit being configured, during switch-off of the first electronic switch, to delay the switch-off in order to allow the first inductance to demagnetize.

5. The driver circuit of claim 1, further comprising a first driver coupled to a control electrode of the first electronic switch, the first driver being configured to generate a drive signal to switch the first electronic switch on an off in accordance with a first control signal.

6. The driver circuit of claim 5, further comprising a first delay circuit coupled to the first driver and configured to delay the first control signal by an adjustable delay time.

7. The driver circuit of claim 1, wherein the bypass circuit includes a second electronic switch connected to the output node; the electric connection between the second electronic switch and the output node having a second inductance.

8. The driver circuit of claim 7, wherein the bypass circuit further includes a clamping circuit coupled to the second electronic switch; the clamping circuit being configured to take over current passing through the second inductance, when the second electronic switch is switched off.

9. The driver circuit of claim 7, further comprising a second driver coupled to a control electrode of the second electronic switch, the second driver being configured to generate a drive signal to switch the second electronic switch on an off in accordance with a second control signal.

10. The driver circuit of claim 9, further comprising a second delay circuit coupled to the second driver and configured to delay the second control signal by an adjustable delay time.

11. The driver circuit of claim 1, further comprising a capacitor coupled between the first electronic switch and the output node, to decouple DC current passing from the first electronic switch to the output node.

12. The driver circuit of claim 11, further comprising a third electronic switch coupled in operably parallel to the laser diode.

13. The driver circuit of claim 1, further comprising a half-bridge including a third electronic switch and a fourth electronic switch coupled between a supply node and a ground node, the middle tap of the half-bridge forming a further output node configured to be operably coupled to the laser diode, so that the laser diode is coupled between the output node and the further output node.

14. The driver circuit of claim 13,
wherein the electric connection between the third electronic switch and the further output node having a third inductance; and
wherein the electric connection between the fourth electronic switch and the further output node having a fourth inductance.

15. The driver circuit of claim 14, further comprising:
a clamping circuit coupled to the third electronic switch; the clamping circuit being configured to take over current passing through the third inductance, when the third electronic switch is switched off; and
a further clamping circuit coupled to the fourth electronic switch; the further clamping circuit being configured to take over current passing through the fourth inductance, when the fourth electronic switch is switched off.

16. A driver circuit for driving a laser diode, the driver circuit comprising:
a first and a second transistor half-bridge forming a H-bridge that has a first output node and a second output node configured to operably couple the laser diode in between, each transistor half-bridge being composed of a high-side transistor and a low-side transistor; and
control circuitry configured to:
switch on, in a pre-charging phase, the high-side and the low-side transistors of the first and the second transistor half-bridges to magnetize any inductances coupled in series to the high-side and the low-side transistors; and
switch off, in a ramp-up phase, the low-side transistor of the first transistor half-bridge and the high-side transistor of the second transistor half-bridge, thus directing current, which passes through the high-side transistor of the first transistor half-bridge and the low-side transistor of the second transistor half-bridge and through inductances coupled in series thereto, through the laser diode via the first and the second output node.

17. A method for driving a laser diode, the method comprising:
directing a first current, via a first electronic switch to an output node operably coupled to the laser diode thus magnetizing a first inductance effective between the first electronic switch and the output node;
draining the first current, by activating a bypass circuit, from the output node thud bypassing the laser diode; and
directing the first current to the laser diode via the output node by deactivating the bypass circuit.

* * * * *